United States Patent
Zhang et al.

(10) Patent No.: US 11,302,676 B2
(45) Date of Patent: Apr. 12, 2022

(54) METHODS OF MAKING LIGHT-EMITTING ASSEMBLIES COMPRISING AN ARRAY OF LIGHT-EMITTING DIODES HAVING AN OPTIMIZED LENS CONFIGURATION

(71) Applicant: Bridgelux, Inc., Livermore, CA (US)

(72) Inventors: Wenhui Zhang, Pleasanton, CA (US); Tao Tong, Pleasanton, CA (US); Zhengqing Gan, Clayton, CA (US)

(73) Assignee: Bridgelux, Inc., Livermore, CA (US)

( * ) Notice: Subject to any disclaimer, the term of this patent is extended or adjusted under 35 U.S.C. 154(b) by 87 days.

(21) Appl. No.: 16/539,972

(22) Filed: Aug. 13, 2019

(65) Prior Publication Data

US 2019/0371770 A1     Dec. 5, 2019

Related U.S. Application Data

(60) Continuation of application No. 16/019,443, filed on Jun. 26, 2018, now Pat. No. 10,381,333, which is a
(Continued)

(51) Int. Cl.
*F21V 5/00*       (2018.01)
*H01L 25/075*     (2006.01)
(Continued)

(52) U.S. Cl.
CPC ........ *H01L 25/0753* (2013.01); *H01L 33/507* (2013.01); *H01L 33/54* (2013.01);
(Continued)

(58) Field of Classification Search
CPC ... H01L 25/0753; H01L 33/60; H01L 33/507; H01L 33/62; H01L 33/56; H01L 33/54;
(Continued)

(56) References Cited

U.S. PATENT DOCUMENTS 6,155,699 A    12/2000   Miller et al.
8,330,176 B2   12/2012   Thompson et al.
(Continued)

OTHER PUBLICATIONS

Non-Final Office Action dated Jun. 29, 2015 in corresponding U.S. Appl. No. 14/046,903, filed Oct. 4, 2013; total 9 pages.
(Continued)

*Primary Examiner* — Andrew J Coughlin
(74) *Attorney, Agent, or Firm* — Snell & Wilmer L.L.P.

(57) ABSTRACT

Light emitting assemblies comprise a plurality of Light Emitting Diode (LED) dies arranged and attached to common substrate to form an LED array having a desired optimum packing density. The LED dies are wired to one another and are attached to landing pads on the substrate for receiving power from an external electrical source via an interconnect device. The assembly comprises a lens structure, wherein each LED die comprises an optical lens disposed thereover that is configured to promote optimal light transmission. Each optical lens has a diameter that is between about 1.5 to 3 times the size of a respective LED die, and is shaped in the form of a hemisphere. Fillet segments are integral with and interposed between the adjacent optical lenses, and provide sufficient space between adjacent optical lenses so that the diameters of adjacent optical lenses do not intersect with one another.

18 Claims, 8 Drawing Sheets

Related U.S. Application Data continuation of application No. 15/075,027, filed on Mar. 18, 2016, now Pat. No. 10,008,482, which is a division of application No. 14/046,903, filed on Oct. 4, 2013, now Pat. No. 9,299,687.

(60) Provisional application No. 61/710,629, filed on Oct. 5, 2012.

(51) Int. Cl.
| | |
|---|---|
| *H01L 33/60* | (2010.01) |
| *H01L 33/50* | (2010.01) |
| *H01L 33/62* | (2010.01) |
| *H01L 33/56* | (2010.01) |
| *H01L 33/54* | (2010.01) |
| *H01L 33/58* | (2010.01) |

(52) U.S. Cl.
CPC .............. *H01L 33/56* (2013.01); *H01L 33/60* (2013.01); *H01L 33/62* (2013.01); *H01L 33/58* (2013.01); *H01L 2924/0002* (2013.01); *H01L 2933/005* (2013.01); *H01L 2933/0041* (2013.01); *H01L 2933/0058* (2013.01); *H01L 2933/0066* (2013.01)

(58) Field of Classification Search
CPC ..... H01L 2933/0058; H01L 2933/9941; H01L 2933/005; H01L 2933/58
USPC .......................................................... 438/27
See application file for complete search history.

(56) References Cited

U.S. PATENT DOCUMENTS

| | | | |
|---|---|---|---|
| 8,399,268 | B1 | 3/2013 | Mei et al. |
| 8,698,171 | B2* | 4/2014 | Yuan ...................... H05B 45/20 257/89 |
| 8,759,123 | B2* | 6/2014 | Wada .................... B29C 43/021 257/98 |
| 8,779,694 | B1 | 7/2014 | Lindblad et al. |
| 8,900,892 | B2 | 12/2014 | Mei et al. |
| 8,956,922 | B2* | 2/2015 | Peil ........................ H01L 33/58 438/127 |
| 9,024,341 | B2 | 5/2015 | Lee et al. |
| 9,105,824 | B2* | 8/2015 | Heikman ................ H01L 33/60 |
| 9,115,853 | B2* | 8/2015 | Bukkems .............. F21V 29/502 |
| 9,234,801 | B2 | 1/2016 | Mei et al. |
| 9,303,857 | B2* | 4/2016 | Desilva .................. F21V 17/164 |
| 9,351,348 | B2* | 5/2016 | Basin ........................ F21V 9/00 |
| 9,425,172 | B2* | 8/2016 | van de Ven ......... H01L 25/0753 |
| 9,793,247 | B2* | 10/2017 | Yuan ......................... F21K 9/00 |
| 2005/0045903 | A1 | 3/2005 | Abe et al. |
| 2006/0105485 | A1* | 5/2006 | Basin ................. G02B 19/0028 438/27 |
| 2006/0138436 | A1 | 6/2006 | Chen et al. |
| 2006/0141851 | A1* | 6/2006 | Matsui .................... F21V 29/73 439/490 |
| 2007/0189007 | A1* | 8/2007 | Nishimoto .............. H01L 24/97 362/227 |
| 2008/0019130 | A1* | 1/2008 | Wang ........................ F21K 9/00 362/249.01 |
| 2008/0203415 | A1 | 8/2008 | Thompson et al. |
| 2010/0213484 | A1 | 8/2010 | Lin |
| 2010/0295070 | A1* | 11/2010 | Su ....................... H01L 25/0753 257/91 |
| 2011/0037091 | A1 | 2/2011 | Fushimi |
| 2011/0058372 | A1 | 3/2011 | Lerman et al. |
| 2011/0315956 | A1* | 12/2011 | Tischler .................... F21K 9/64 257/13 |
| 2012/0104435 | A1 | 5/2012 | Lee et al. |
| 2014/0077235 | A1* | 3/2014 | Kwon .................... H01L 24/82 257/88 |

OTHER PUBLICATIONS

Notice of Allowance dated Nov. 20, 2015 in corresponding U.S. Appl. No. 14/046,903, filed Oct. 4, 2013; total 7 pages.
Non-Final Office Action dated Oct. 13, 2017 in corresponding U.S. Appl. No. 15/075,027, filed Mar. 18, 2016; total 12 pages.
Notice of Allowance dated Feb. 28, 2018 in corresponding U.S. Appl. No. 15/075,027, filed Mar. 18, 2016; total 7 pages.
Non-Final Office Action dated Oct. 4, 2018 in corresponding U.S. Appl. No. 16/019,443 fled Jun. 26, 2018; total 6 pages.
Notice of Allowance dated Mar. 29, 2019 in corresponding U.S. Appl. No. 16/019,443, filed Jun. 26, 2018; total 12 pages.

* cited by examiner

2mm lens 2.8mm lens 3.4mm lens

METHODS OF MAKING LIGHT-EMITTING ASSEMBLIES COMPRISING AN ARRAY OF LIGHT-EMITTING DIODES HAVING AN OPTIMIZED LENS CONFIGURATION

CROSS-REFERENCE TO A RELATED APPLICATION

The present Application for Patent is a continuation of U.S. patent application Ser. No. 16/019,443 filed Jun. 26, 2018, now U.S. Pat. No. 10,381,333, issued Aug. 13, 2019, which is a continuation of U.S. patent application Ser. No. 15/075,027, filed on Mar. 18, 2016, now U.S. Pat. No. 10,008,482, issued Jun. 26, 2018, which is a divisional of U.S. patent application Ser. No. 14/046,903, filed on Oct. 4, 2013, now U.S. Pat. No. 9,299,687, issued Mar. 29, 2016, which claims priority to U.S. Provisional Application No. 61/710,629, filed on Oct. 5, 2012, entitled "LIGHT-EMITTING ASSEMBLIES COMPRISING AN ARRAY OF LIGHT-EMITTING DIODES HAVING AN OPTIMIZED LENS CONFIGURATION," which applications are herein incorporated by reference in their entireties.

TECHNICAL FIELD

The present invention relates generally to light-emitting assemblies comprising a plurality of light-emitting diodes and, more specifically, to an array of light-emitting diodes that have been specifically arranged and that have lenses configured to provide optimal space utilization, packaging and light transmission.

BACKGROUND

A light emitting diode (LED) is a solid state device that converts electrical energy to light. Light is emitted from active layers of semiconductor material sandwiched between oppositely doped layers when a voltage is applied across the doped layers. In order to use an LED chip, the chip is typically enclosed in a package that focuses the light and that protects the chip from being damaged. The LED package typically includes contact points for electrically connecting the LED package to an external circuit or power source. Conventionally, LED chips are designed to be packaged either as a discrete light emitter or with a group of LED chips, e.g., in an array, to provide a light-emitting assembly.

Light-emitting assemblies comprising an array of LEDs include a number of LED dies that have been arranged in some predetermined fashion. It is known for conventional LED arrays to make use of one or more lenses for the purpose of both protecting the underling LED dies from being physically damaged, e.g., from contact with an external object, and for facilitating the emission of light from LEDs.

Existing lenses known in the art used with LED arrays are provided in the form of a pre-formed dome-shaped member that is sized and shaped to fit over a number of LED dies, and operate to provide a focused light emission. The lens is formed from glass or plastic, and includes attachment elements for providing a secure fit with a substrate. The lens can include a phosphor layer provided along a bottom surface adjacent the LED dies to provide a desired color light, e.g., white light.

Other light-emitting assemblies known in the art comprises lenses that are not provided as a pre-formed element, but that are provided in the form of a lens-forming material that is disposed over the LED dies, and that is shaped into a desired end-use configuration by cast molding, injection molding, or compression molding technique. In such conventional embodiments, the lens material is provided over an existing transparent protective layer disposed over the LED dies.

While light-emitting assemblies, comprising an array of LEDs, making use of LED dies and the above-noted lens constructions are somewhat useful in facilitating the emission of light from an array of LEDs, such light-emitting assemblies are limited in terms of their ability to provide an LED array having optimized packaging and lens construction to facilitate a light-emitting assembly construction capable of providing an optimized light output/transmission in a relatively small spatial package, thereby limiting potential end-use applications.

It is, therefore, desired that light-emitting assemblies, comprising an LED array formed from a plurality of LED dies, be developed in a manner having an optimized LED die spatial arrangement/packing density together with an optimized lens construction to provide a desired efficiently-packaged assembly having a high-light output/transmission when compared to conventional LED light-emitting assemblies. It is further desired that such assemblies be manufactured in a manner that is cost effective from a labor and/or a raw material perspective.

SUMMARY

Light emitting assemblies as disclosed herein comprise a plurality of Light Emitting Diode (LED) dies arranged in a fixed position relative to one another on a common substrate and a highly-reflective material can be interposed therebetween. The LED dies form an array and are positioned with respect to provide a desired optimum packing density. In an example embodiment, the LED array comprises a number of LED dies arranged in the form of a closed circle with one or more LED dies disposed within the circle. The LED dies are mounted on a substrate and are wired to one another and are attached to landing pads on the substrate for purposes of providing contact with an external electrical or source via a separate interconnect structure or the like.

A feature of light emitting assemblies as disclosed herein is that they are configured having a lens structure wherein each LED die comprises an optical lens disposed thereover. Each optical lens, or lens per die (LPD) is shaped and sized to promote optimal light transmission of each respective LED die, and thus form the LED array. The lens is formed from silicone that comprises phosphor particles dispersed therein. In an example embodiment, each optical lens has a diameter that is between about 1.5 to 3 times, and preferably between about 2 to 3 times the size of a respective LED die. The optical lenses are preferably shaped in the form of a hemisphere, and are sized such that the diameters of adjacent lenses do not overlap with one another.

The lens structure also comprises fillet segments that are interposed between adjacent LED dies and respective optical lenses. Such fillet segments are integral with adjacent optical lenses and are formed from same material as the optical lenses. In an example embodiment, the fillet segment has thickness as measured from the surface of the substrate that is less than about 1 times, and preferably less than about ½ times, the size of a respective LED die. In an example embodiment, the fillet segment has a radius of curvature between adjacent optical lenses, and provides a sufficient space between adjacent optical lenses so that the diameters of adjacent optical lenses avoid intersecting with one another.

Light emitting assemblies constructed in this manner display optimized LED die spatial arrangement/packing density together with an optimized lens construction to provide a desired efficiently-packaged assembly having a high-light output/transmission when compared to conventional LED light-emitting assemblies.

BRIEF DESCRIPTION OF THE DRAWINGS

These and other features and advantages of light-emitting assemblies and methods for making the same as disclosed herein will be appreciated as the same becomes better understood by reference to the following detailed description when considered in connection with the accompanying drawings.

DETAILED DESCRIPTION

Light-emitting assemblies as disclosed herein comprise an LED array made up of a number of LED dies, wherein the LED dies are specially arranged in a predetermined manner so as to provide an efficient packing that produces an optimized light output, and wherein each LED die comprises a lens or lens per die (LPD) that is specially configured to provide an optimum light transmission. Reference will now be made in detail to some embodiments of such light-emitting assemblies, examples of which are illustrated in the accompanying drawings.

Figure 1:
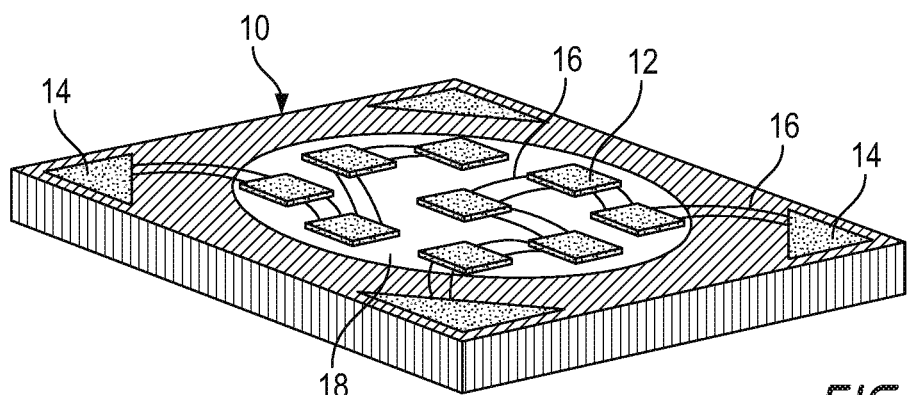
FIG. 1 is a perspective view of example embodiment light emitting assembly comprising an LED array made up of nine LED dies disposed a MCPCB substrate.

FIG. 1 is a top view of an example embodiment metal-core printed circuit board (MCPCB) substrate 10 on which an array of LED dies 12 are mounted. The LED dies are made by conventional method and are singulated from a wafer prior to attachment onto the substrate. Because the substrate 10 has a metal core, it would be difficult to supply power to the LED dies 12 through through-hole vias that pass from the LEDs through the printed circuit board to a bottom surface of the board. Thus, the LED dies 12 are electrically connected to landing pads 14 positioned on the top surface of the substrate 10.

While substrate 10 has been illustrated in FIG. 1 as having a generally square configuration, it is to be understood that substrates as used for forming light-emitting assemblies as disclosed herein may be configured having various different geometric shapes based for example on the particular end-use application. Additionally, while the landing pads 14 are illustrated in FIG. 1 as being at the corners of the substrate, the placement and configuration of the landing pads can also vary. Such variations in substrate shape and landing pad location and configuration are understood to be within the scope of light-emitting assemblies as disclosed herein.

The LED dies are arranged on the substrate in a manner that provides optimal light output for an optimized spatial packing density, as the spatial packing density reflects a compromise based on the desired emitting area and photometric power. The particular example embodiment illustrated in FIG. 1 comprises an LED array made up of nine LED dies arranged in a special configuration; namely, with one LED die positioned in the middle and surrounded in circular fashion by eight LED dies. This LED die arrangement is desired as it enables the LED dies to be equally spaced apart from one another. The LED dies 12 are electrically connected both to one another and to the landing pads 14 by wire bonds 16. The substrate surface comprises a highly-reflective material 18 that the LED dies are disposed upon.

In such example embodiment, the LED dies 12 are arranged relative to one another having an optimized packing density that is not too tight (so as to minimize or prevent adjacent LED die light output from interfering or being absorbed with one another), and that is not too loose (so as to increase the flux density and minimize the total space occupied by the LED dies). The LED dies are spaced apart in a predetermined manner calculated to provide optimal LED array light output while occupying a minimum amount of space.

In an example embodiment, is it desired that the LED dies be arranged relative to one another so that the distance between adjacent LED dies (as measured from the middle of each adjacent die) is about 2.2 times the die size, and in an example embodiment less than about 4 times, and preferably about 3 times or less, the die size. It is to be understood that the exact distance between adjacent LED dies in the array as disclosed herein may vary depending on such factors as the size and/or number of the LED dies. For a particular embodiment where the LED die size is approximately 45 mils (1.143 mm), a desired spatial distance between adjacent LED dies is approximately 3.4 mm.

Figure 2A:
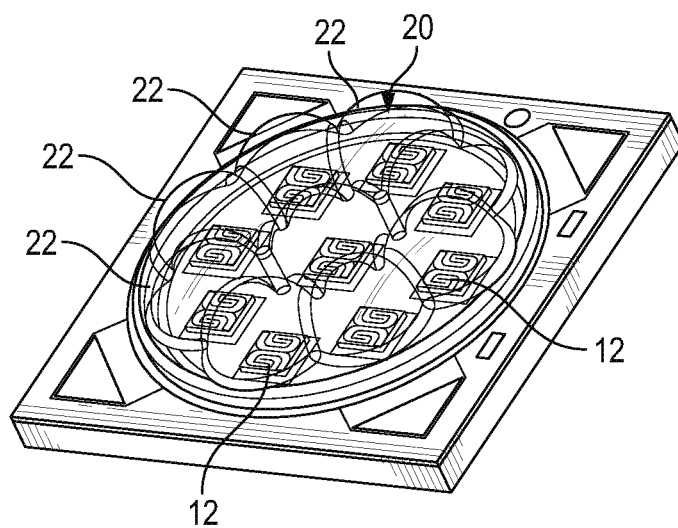
FIGS. 2*a* and 2*b* are perspective views of the example embodiment light emitting assembly of FIG. 1 that includes a lens disposed over each LED die.

FIG. 2*a* illustrates a light emitting assembly 19 comprising the LED array of FIG. 1, comprising a lens structure 20 disposed over the LED dies. Specifically, the lens structure 20 comprises a lens 22 disposed over each individual LED die 12 or a lens per die (LPD). Accordingly, in such example embodiment, each LED die 12 comprises its own lens 22 that is disposed thereover. In an example embodiment, the lens structure is not provided as a preformed member, but is formed by using a suitable silicone material comprising a wavelength conversion material, such as phosphor particles or the like, dispersed therein. The silicone material is provided in a mold cavity having the desired LPD configuration, and the mold cavity and substrate are brought together under vacuum conditions, and the combined assembly is subjected to compressive force to form the desired lens structure by compression molding technique. Thus, in a preferred embodiment the individual LPDs and lens structure are formed in a single compression molding step.

Figure 2B:
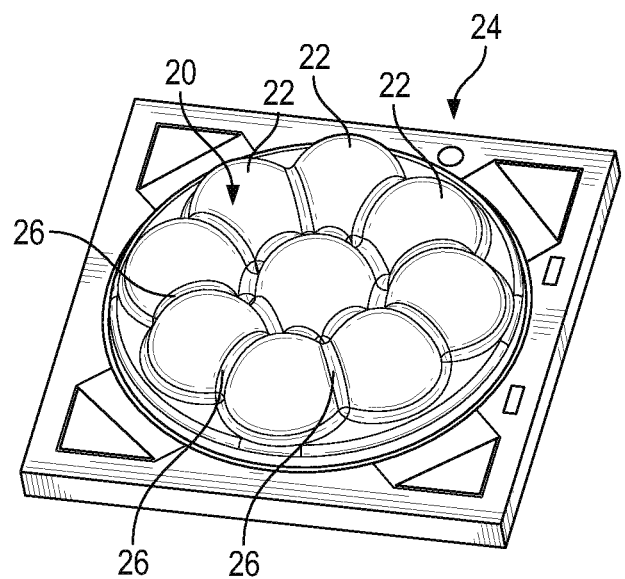

FIG. 2b illustrates the light emitting assembly of FIG. 2a, and better shows the LPDs 22 as being configured having a hemispherical dome shape defined by a particular diameter or radius of curvature. Generally, it is desired to use the largest possible LPD diameter for a fixed number and arrangement/position of LED dies as long as the LPDs of adjacent LED dies do not overlap with one another, i.e., do not have hemispheres that overlap with one another, as such overlap may cause unwanted light transmission interference. Accordingly, the LPDs as disclosed herein are sized having a diameter engineered to provide an optimal light transmission for a fixed number and arrangement/position of LED dies.

In an example embodiment, it is desired that the LPDs each have a diameter that is between about 1.5 to 3 times the size of an LED die (measured as a side length) that it is disposed over. It has been discovered that having a diameter less than about 1.5 times the LED die size is undesired because it will produce a decrease in the desired luminous output. It is theorized that such a result may be due to a reduced phosphor mean free path, causing light emitted from the LED die to be reflected back onto the LED die and not transmitted outwardly therefrom. Additionally, light produced by the LED die may be confined within the LPD when sized too small because the LED die is not centered to the LPD and, thus may be prone to internal reflection also reducing light transmission. Having a LPD diameter greater than about 3 times the LED die size, for a given number and arrangement/position of LED dies, can cause overlapping of adjacent LPDs, which as noted above is not desired for the interference in light transmission that that may occur between adjacent LED dies.

In a preferred embodiment, where the LED die size is approximately 45 mils, it is desired that LPD have a diameter that is between about 2 to 3 times the size of a respective LED die. In an example embodiment where the LED die size is approximately 45 mils and the LED dies are arranged in the manner disclosed above, a LPD die size of approximately 2.8 mm or 2.45 times the LED die size provides an optimum level of light transmission efficiency for the optimized LED array packaging size.

Figure 4A:
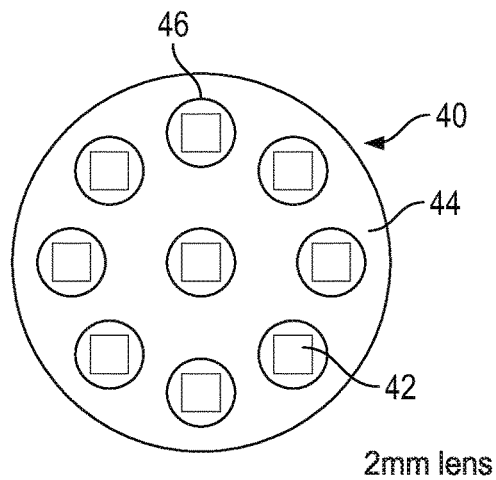
FIGS. 4*a* to 4*c* are top plan views of example embodiment light emitting assemblies having different sized lenses per dies.
Figure 5:
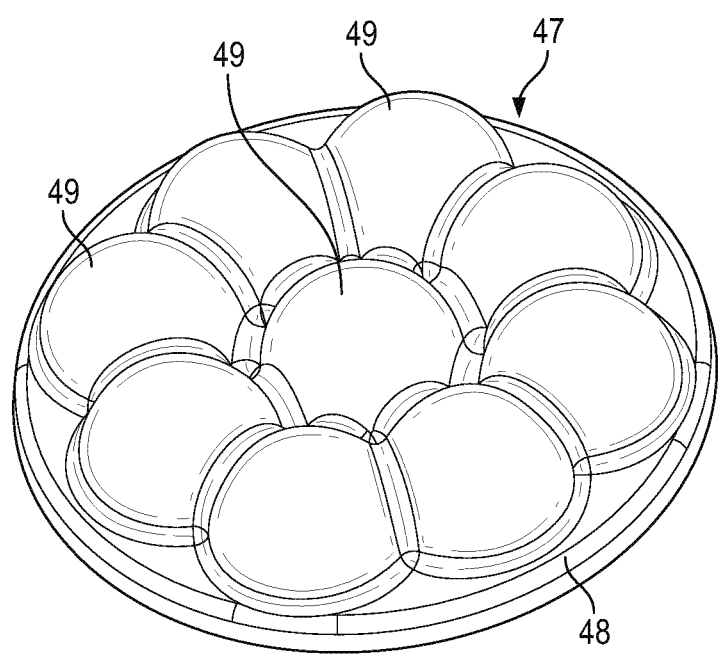
FIG. 5 is a perspective view of an example embodiment light emitting assembly comprising an LED array made up of 9 LED dies with a lens over each LED die.
Figure 6:
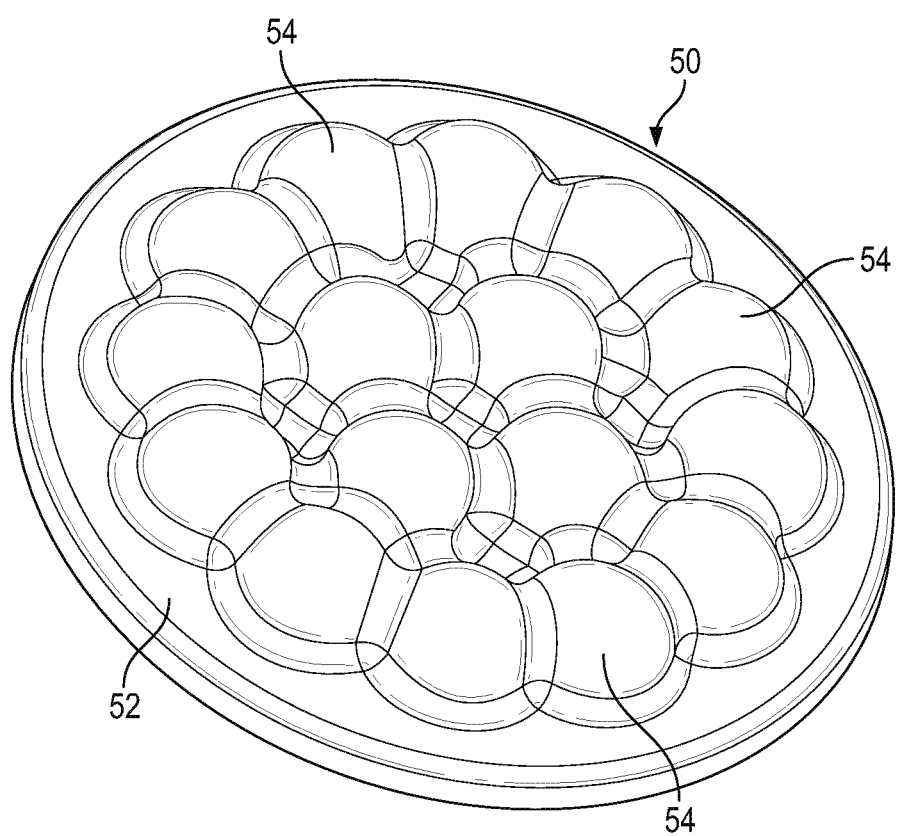
FIG. 6 is a perspective view of another example embodiment light emitting assembly comprising an LED array made up of 16 LED dies with a lens over each LED die.

Referring still to FIG. 2b, while the LPDs 22 in the lens structure 20 are sized so as to avoid overlapping, i.e., of the adjacent hemispheres, adjacent LPDs are connected to one another via fillets or filler regions 26 (as best illustrated in FIGS. 4d, 5 and 6), which are formed integrally with the LPDs and that are essentially thin sections of the lens material that extend between adjacent LPDs 22. The fillets result from the compression molding process and, in an example embodiment, the fillets have a thickness (as measured from the surface of the substrate) of less than about one times the size of the LED dies, and preferably less than about ½ the size of the LED dies. The fillets may be formed having a concave radiused-shape or having a sharp v-shape between adjacent LPDs.

Figure 3:
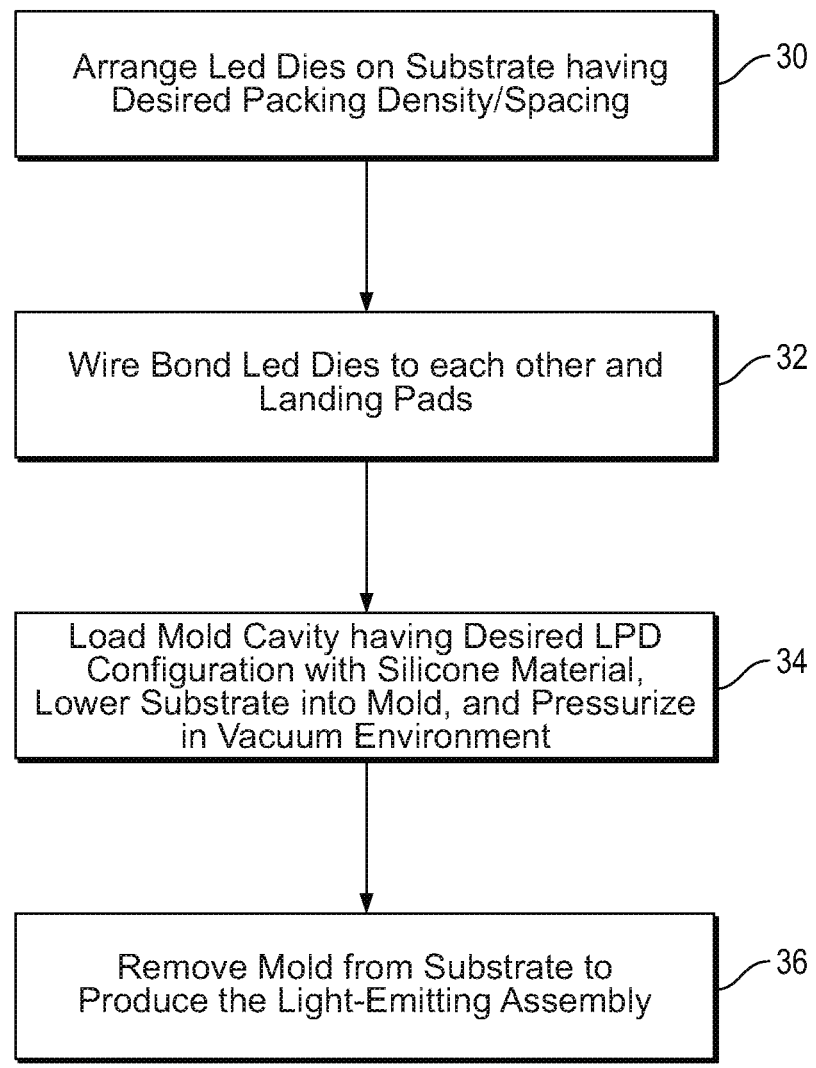
FIG. 3 is a flowchart illustrating the steps used for making the example embodiment light emitting assembly of FIGS. 1 and 2.

FIG. 3 is a flow chart illustrating the steps involved in forming a light-emitting assembly as disclosed herein. In a first step 30 the LED dies are arranged on the MCPCB substrate to form a desired LED array having the disclosed packing density or spacing. In a second step 32, the LED dies are wire bonded to one another and to the substrate landing pads. In a third step 34, a silicone material is disposed within a mold cavity designed having a LPD size as disclosed above, and the substrate is lowered into the mold, and the assembly of the substrate and the mold are subjected to pressure in a vacuum environment. In a fourth step 36, the pressure is removed, and the mold is removed from the substrate to produce the light-emitting assembly comprising the LED array having optimized LED packing and optimized LPD sizing to provide optimal light output efficiency.

Figure 4B:
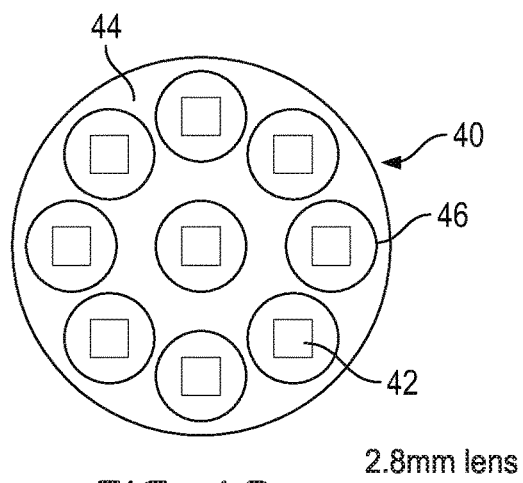
Figure 4C:
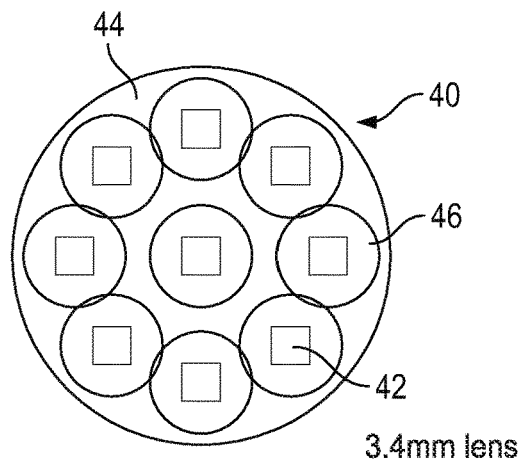

FIGS. 4a to 4c illustrate a top view of different example embodiment light-emitting assemblies 40 that is the same or similar to that shown in FIG. 2, comprising nine LED dies 42 that each have a size of approximately 45 mils (1.143 mm), and that are arranged on the substrate 44 in the manner described above. Each assembly 40 comprises nine LPDs 46 that are disposed on each of the LED dies 42, and that are sized and shaped in the same manner as described above.

Specifically, FIG. 4a illustrates a light emitting assembly 40 comprising LPDs having a size of approximately 2 mm (or 1.75 times the LED die size), while FIG. 4b illustrates a light emitting assembly 40 comprising LPDs having a size of approximately 2.8 mm (or 2.45 times the LED die size), and while FIG. 4c illustrates a light emitting assembly 40 comprising LPDs having a size of approximately 3.4 mm (or 2.97 times the LED die size).

FIG. 5 illustrates an example embodiment light-emitting assembly 47 (similar to that illustrated in FIG. 2b) comprising an LED array made up of 9 LED dies (not visible) that are disposed on an MCPCB substrate 48, and where each LED die is covered by a lens 49. The LED dies are arranged as disclosed above with respect to the embodiment illustrated in FIGS. 2a and 2b. The LED dies in this arrangement are positioned at a distance relative to one another as disclosed above to provide the desired packing density, and the LPDs are sized and shaped in the manner disclosed above to provide the combined properties of optimal light transmission efficiency and minimal packaging size.

FIG. 6 illustrates another example embodiment light-emitting assembly 50 comprising an LED array made up of 16 LED dies (not visible) that are disposed on an MCPCB substrate 52, and where each LED die is covered by a lens 54. The LED dies are arranged with four LED dies disposed within a circular arrangement of twelve LED dies, wherein the four LED dies arranged in two pairs of two. The LED dies in this arrangement are positioned at a distance relative to one another as disclosed above to provide the desired packing density, and the LPDs are sized and shaped in the manner disclosed above to provide the combined properties of optimal light transmission efficiency and minimal packaging size. In an example embodiment, the LED dies have a size of approximately 33 mils (0.84 mm), and a LPD dimension is approximately 2 mm, or 2.4 times the LED die size.

Figure 7:
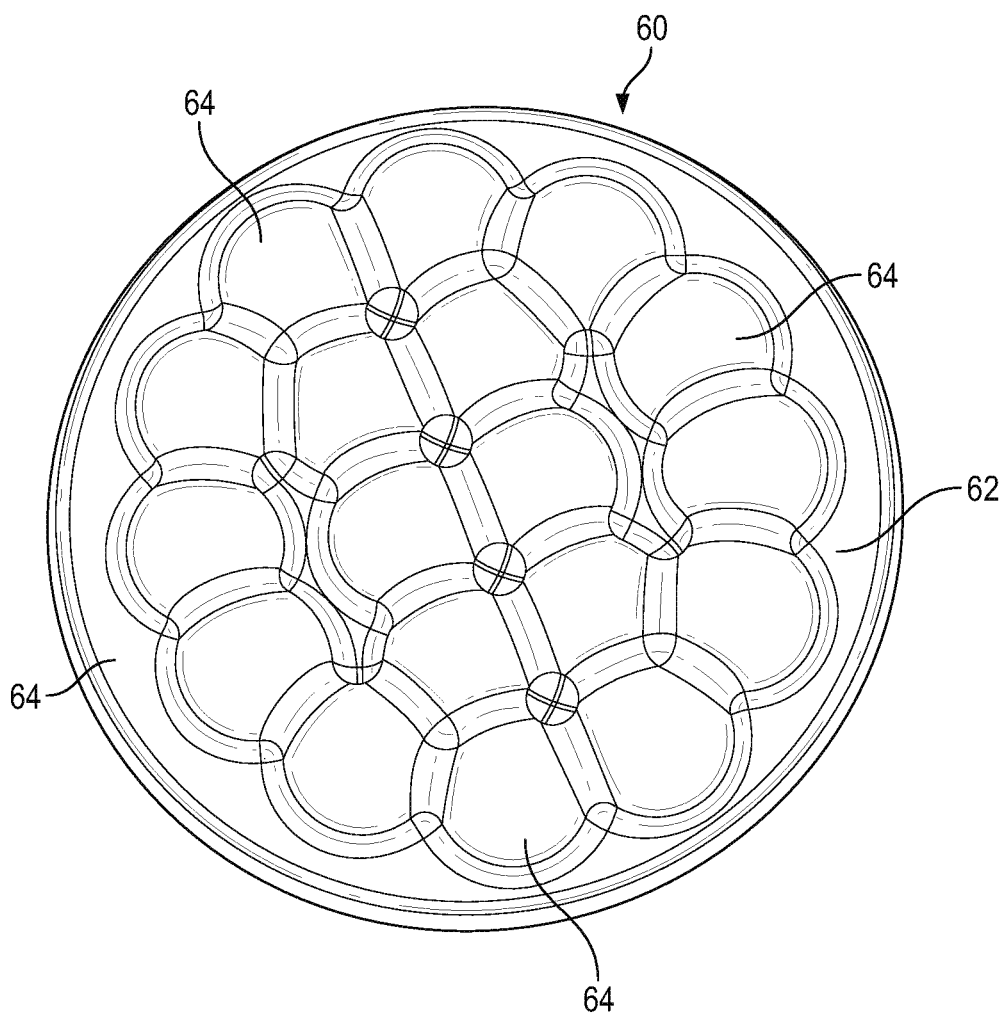
FIG. 7 is a perspective view of another example embodiment light emitting assembly comprising an LED array made up of 18 LED dies with a lens over each LED die.

FIG. 7 illustrates another example embodiment light-emitting assembly 60 comprising an LED array made up of 18 LED dies (not visible) that are disposed on an MCPCB substrate 62, and where each LED die is covered by a lens 64. The LED dies are arranged with six LED dies disposed within a circular arrangement of twelve LED dies, wherein the six LED dies arranged in three pairs of two. The LED dies in this arrangement are positioned at a distance relative to one another as disclosed above to provide the desired packing density, and the LPDs are sized and shaped in the manner disclosed above to provide the combined properties of optimal light output efficiency and minimal packaging size. In an example embodiment, the LED dies have a size of approximately 33 mils (0.84 mm), and a LPD dimension is approximately 2 mm, or 2.4 times the LED die size.

Figure 8:
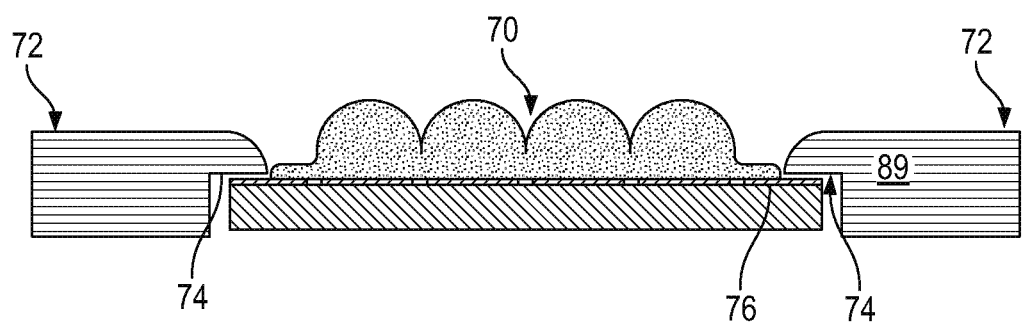
FIG. 8 is a cross sectional view of an example light emitting assembly as disclosed herein illustrating its connection to an interconnect substrate.

FIG. 8 illustrates a sectional view of a connection between the light emitting assembly 70 as disclosed herein with an interconnect substrate 72. In an example embodiment, the interconnect substrate 72 is configured having electrical contact points 74 that are positioned to make contact with the landing pads 76 of the substrate when brought into position and contact with one another to facilitate the passage of electricity to the light emitting assembly. It is to be understood that this is but one example embodiment of how the light emitting assembly may achieve electrical connection with an interconnect substrate, and that the particular manner in which such electrical interconnection is achieved can and will vary depending on the particular end-use application and device configuration.

Figure 9:
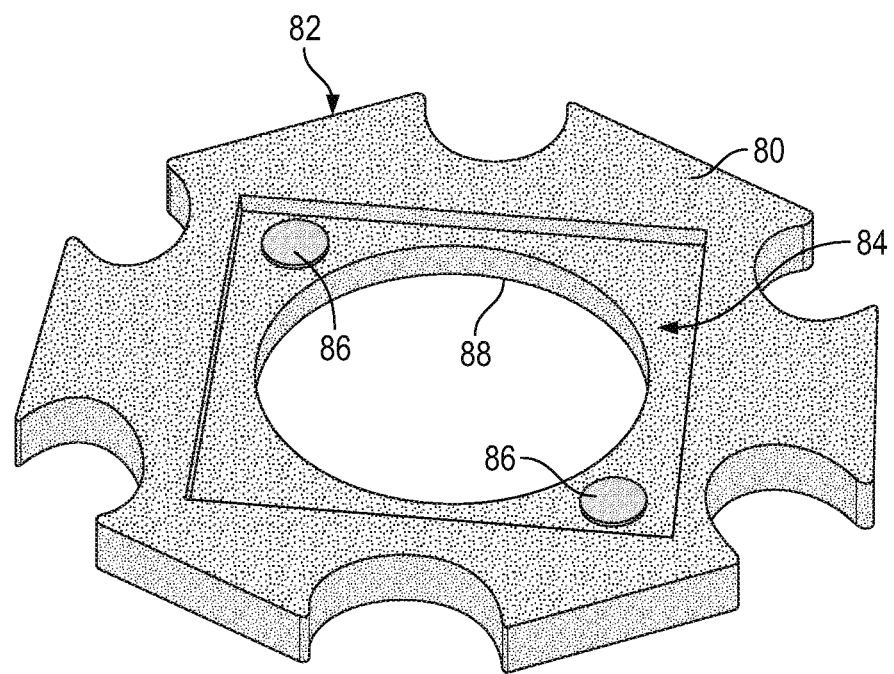
FIG. 9 is perspective view of the bottom surface of an example interconnect structure.
Figure 10:
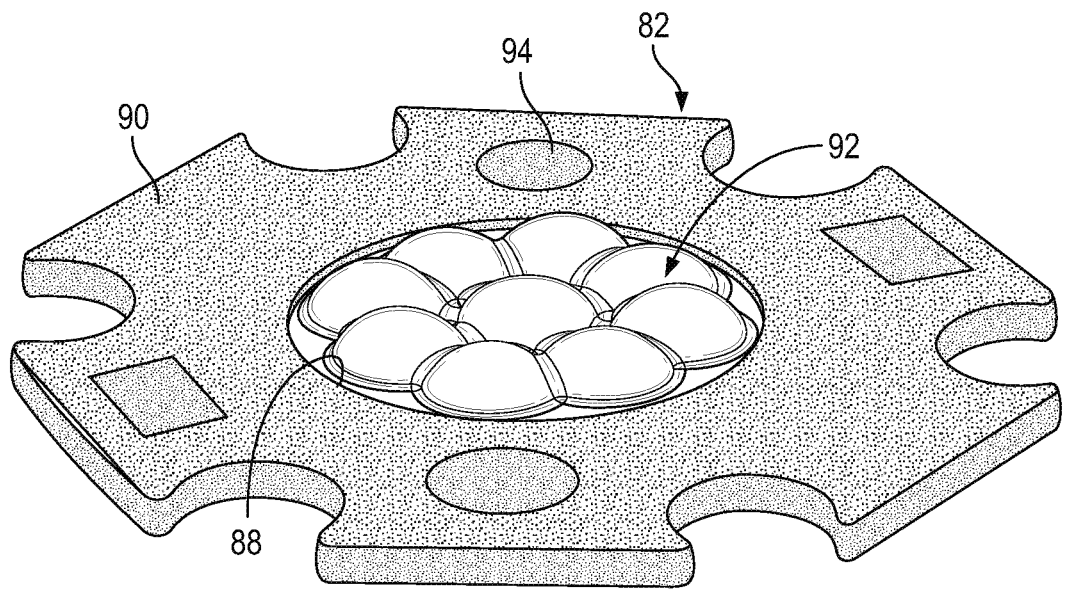
FIG. 10 is a top perspective view of the interconnect structure of FIG. 9 supporting the light emitting assembly of FIG. 2.

FIG. 9 illustrates a bottom surface 80 of an interconnect substrate 82 that can be used in conjunction with the light emitting assemblies as disclosed herein. The interconnect substrate 82 is formed from an electrically insulating material and includes a recessed section or an indentation 84 that is configured to accommodate placement of a light emitting assembly substrate (such as the one illustrated in FIG. 2) therein. The recessed section 84 includes a pair of electrical contact pads 86 positioned to cooperate with and provide an electrical connection with the landing pads on the assembly substrate. The interconnect substrate 82 includes a central opening 88 sized for placement of the LED array on the light emitting assembly substrate therethrough (as best illustrated in FIG. 10). This is but one example interconnect substrate configuration provided for reference, and it is to be understood that many other configurations of the same that provide the same basic function of providing an electrical interface with the light emitting assembly are equally covered herein.

FIG. 10 illustrates a top surface 90 of the interconnect substrate 82 illustrated in FIG. 8, now including a light emitting assembly 92 (as illustrated in FIG. 2 and as disclosed herein) attached from the bottom surface with its LED array extending through the central opening 88, and with its landing pads (not shown) in electrical connection with the interconnect substrate contact pads. The interconnect substrate 82 includes contact pads 94 on its top surface to facilitate connection with an external construction or fixture (not shown) having a source of electricity thereto. Constructed in this manner, the interconnect substrate functions to facilitate an electrical connection between the external construction or fixture to the light emitting assembly.

A feature of light-emitting assemblies as disclosed herein is the construction of a LED array that is intentionally engineered to be compact and space efficient to provide optimized light output, and that make use of individual LED die lenses that are specially configured and that are formed in a single mold process to optimize light transmission efficiency, thereby resulting in a highly-compact and efficient light source. Light-emitting assemblies as disclosed herein are formed on a substrate having surface mounted electrical contacts configured for use with a variety of different interconnect substrates to facilitate use in a number of different lighting fixtures to meet the needs of a variety of end-use lighting applications.

Although certain specific embodiments have been described and illustrated for purposes or reference, it is to be understood that the disclosure and illustrations as provided herein not limited to the specific embodiments. Accordingly, various modifications, adaptations, and combinations of various features of the described embodiments can be practiced without departing from the scope of the invention as set forth in the claims.

What is claimed is:

1. A light emitting assembly comprising a plurality of Light Emitting Diode (LED) dies arranged in a fixed position relative to one another on a common upper surface of a substrate, wherein the LED dies are electrically connected to one another by electrical conductors running between the LED dies along the upper surface, wherein a lens structure is disposed over and in contact with all of the LED dies and in contact with the substrate upper surface extending between the LED dies, wherein the lens structure comprises a number of optical lenses that are disposed over respective LED dies, wherein the optical lenses are integrally connected with one another forming a one-piece construction with the lens structure, and wherein the LED dies are arranged in a circular pattern.

2. The light emitting assembly as recited in claim 1, wherein the substrate includes a high-reflective material that the LED dies are disposed thereon.

3. The light emitting assembly as recited in claim 1, wherein the electrical connectors connecting the LED dies are wire bond connectors connection.

4. The light emitting assembly as recited in claim 1, wherein each optical lens is sized about 1.5 to 3 times the size of a respective LED die.

5. The light emitting assembly as recited in claim 4, wherein the LED dies form an array, and wherein the LED dies are spaced apart from one another and the distance between adjacent LED dies is less than about 4 times the LED die size as measured from a middle of adjacent LED dies.

6. The light emitting assembly as recited in claim 5, wherein the distance between adjacent LED dies is less than about 3 times the LED die size as measured from a middle of adjacent LED dies.

7. The light emitting assembly as recited in claim 1, wherein each optical lens is configured comprising a hemispherical shape with a diameter sized slightly larger than a respective LED die.

8. The light emitting assembly as recited in claim 1 further comprising an interconnect substrate, wherein the interconnect substrate is configured to surround the common substrate and comprises one or more electrical contact pads configured to make contact with one or more landing pads of the substrate.

9. The light emitting assembly as recited in claim 1 comprising LEDs that are arranged within the circular pattern of LEDs.

10. A light emitting assembly comprising:
a plurality of Light Emitting Diode (LED) dies positioned in a circular arrangement and spaced apart from one another on a common upper surface of a substrate, wherein the LED dies are electrically connected to each other along the upper surface forming an LED array, and wherein the common substrate is in electrical connection with the LED array, wherein the LED array comprises a lens structure disposed over and in contact with LED dies and in contact with the substrate upper surface extending between the LED dies, the lens structure comprising a number of optical lenses equal in number to the LED dies and that are each disposed over a respective LED die and that are integrally connected together forming a one-piece construction of the lens structure; and
an interconnect substrate comprising electrical contact pads, wherein the interconnect substrate is configured to accommodate fitment with the common substrate such that the common substrate landing pads are in contact with the electrical contact pads for transmitting electricity from the interconnection substrate to the LED array.

11. The light emitting assembly as recited in claim 10, wherein the landing pads are positioned along a peripheral portion of the common substrate away from the LED array, wherein the interconnect substrate includes a surface portion configured to accommodate fitment with the peripheral portion of the common substrate, and wherein the surface portion comprises the electrical contact pads.

12. The light emitting assembly as recited in claim 11, wherein the interconnection substrate surface portion comprises a recessed portion in which the common substrate resides.

13. The light emitting assembly as recited in claim 10, wherein each optical lens of the lens structure is configured having a hemispherical shape over each respective LED die.

14. The light emitting assembly as recited in claim 13, wherein adjacent optical lenses comprise a connecting section extending therebetween and between adjacent LED dies, the connecting section having a height as measured from the common substrate less than a height of the adjacent optical lenses.

15. The light emitting assembly as recited in claim 14, wherein the LED dies are spaced apart equidistantly from one another.

16. A method of making a light emitting assembly comprising the steps of:
   arranging a number of Light Emitting Diode (LED) dies in a circular pattern on a common upper surface of a substrate in a manner wherein the dies are spaced a distance apart from an adjacent LED die less than about 4 times the LED die size as measured between a middle of the adjacent LED dies;
   electrically connecting the LED dies to one another and to landing pads disposed on the common substrate;
   loading a mold cavity configured to provide a lens structure comprising a lens for each respective LED die with a silicone material and combining the common substrate with the mold to form an assembly such that the silicone material encapsulates the LED dies and the upper surface of the substrate extending between the LED dies;
   pressurizing the assembly in a vacuum environment; and
   removing the mold from the common substrate, wherein the resulting light emitting assembly comprises the LED dies having the lens structure disposed thereover, wherein the lens structure comprises an integral optical lens disposed over each respective LED die, wherein the optical lenses are a one-piece construction with the lens structure, and wherein each respective optical lens has a hemispherical configuration with a diameter that is from about 1.5 to 3 times the size of a respective LED die.

17. The method as recited in claim 16, wherein during the step of pressurizing, the respective optical lenses are formed and comprise connecting sections interposed between adjacent lenses having a height as measured from the substrate less than a height of each lens.

18. The method as recited in claim 16, wherein before the step of arranging, a highly-reflective material is disposed onto a substrate upper surface and the LED dies are disposed thereon.

* * * * *